United States Patent
Wu et al.

(10) Patent No.: US 11,848,504 B2
(45) Date of Patent: Dec. 19, 2023

(54) DEVICE AND METHOD FOR COMMUNICATION

(71) Applicant: HTC Corporation, Taoyuan (TW)

(72) Inventors: Chun-Yih Wu, Taoyuan (TW); Ta-Chun Pu, Taoyuan (TW); Yen-Liang Kuo, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 17/715,351

(22) Filed: Apr. 7, 2022

(65) Prior Publication Data

US 2023/0120800 A1 Apr. 20, 2023

Related U.S. Application Data

(60) Provisional application No. 63/255,445, filed on Oct. 14, 2021.

(51) Int. Cl.
*H01Q 1/24* (2006.01)
*H01Q 3/44* (2006.01)
*H01L 27/32* (2006.01)
*H01Q 15/14* (2006.01)
*H10K 59/00* (2023.01)

(52) U.S. Cl.
CPC .............. *H01Q 3/44* (2013.01); *H01Q 15/14* (2013.01); *H10K 59/00* (2023.02)

(58) Field of Classification Search
CPC ............ H01Q 1/24; H01Q 1/243; H01Q 1/44; H01Q 15/00; H01Q 15/002; H01Q 15/14; H01Q 3/44; H10K 59/00; G06F 1/16; H01L 27/32; H01L 27/3218; H01L 27/3234

See application file for complete search history.

(56) References Cited

U.S. PATENT DOCUMENTS

| | | | |
|---|---|---|---|
| 10,211,532 B2 * | 2/2019 | Foo | H01Q 21/061 |
| 10,249,949 B2 * | 4/2019 | Li | H01Q 7/00 |
| 10,943,564 B2 * | 3/2021 | Choong | H10K 71/00 |
| 11,050,138 B2 * | 6/2021 | Huang | H01Q 21/065 |
| 11,233,320 B2 * | 1/2022 | Lu | H01Q 3/44 |
| 11,672,144 B2 * | 6/2023 | Lee | H10K 59/121 |
| | | | 257/79 |
| 11,740,659 B2 * | 8/2023 | Yim | G06F 1/1643 |
| | | | 455/575.3 |
| 2019/0196403 A1 | 6/2019 | Guan et al. | |
| 2020/0371355 A1 | 11/2020 | Wagner et al. | |
| 2021/0328327 A1 * | 10/2021 | Paulotto | H01Q 9/0414 |

FOREIGN PATENT DOCUMENTS

| | | |
|---|---|---|
| CN | 111584756 A | 8/2020 |
| WO | WO 2020/034077 A1 | 2/2020 |

* cited by examiner

*Primary Examiner* — Tho G Phan
(74) *Attorney, Agent, or Firm* — Birch, Stewart, Kolasch & Birch, LLP

(57) ABSTRACT

A communication device includes a display device, a phase tuning layer, and a mmWave (Millimeter Wave) module. The display device includes a first display portion and a second display portion. The pixel density of the first display portion is greater than that of the second display portion. The phase tuning layer is adjacent to the second display portion. The mmWave module generates a wireless signal. The wireless signal is propagated through the second display portion and the phase tuning layer.

20 Claims, 12 Drawing Sheets

DEVICE AND METHOD FOR COMMUNICATION

CROSS REFERENCE TO RELATED APPLICATIONS

This application claims the benefit of U.S. Provisional Application No. 63/255,445, filed on Oct. 14, 2021, the entirety of which is incorporated by reference herein.

BACKGROUND OF THE INVENTION

Field of the Invention

The invention relates to a communication device, and more particularly, to a communication device and a communication method thereof.

Description of the Related Art

With the advancements being made in mobile communication technology, mobile devices such as portable computers, mobile phones, multimedia players, and other hybrid functional portable electronic devices have become more common. To satisfy user demand, mobile devices can usually perform wireless communication functions. Some devices cover a large wireless communication area; these include mobile phones using 2G, 3G, and LTE (Long Term Evolution) systems and using frequency bands of 700 MHz, 850 MHz, 900 MHz, 1800 MHz, 1900 MHz, 2100 MHz, 2300 MHz, and 2500 MHz Some devices cover a small wireless communication area; these include mobile phones using Wi-Fi and Bluetooth systems and using frequency bands of 2.4 GHz, 5.2 GHz, and 5.8 GHz.

The mmWave (Millimeter Wave) communication is an operational frequency band which is rapidly developing recently, but it has the disadvantage of being easily interfered with by adjacent components (e.g., a display device). Accordingly, there is a need to propose a novel solution for solving the problems of the prior art.

BRIEF SUMMARY OF THE INVENTION

In a preferred embodiment, the invention proposes a communication device that includes a display device, a phase tuning layer, and a mmWave (Millimeter Wave) module. The display device includes a first display portion and a second display portion. The pixel density of the first display portion is greater than that of the second display portion. The phase tuning layer is adjacent to the second display portion. The mmWave module generates a wireless signal. The wireless signal is propagated through the second display portion and the phase tuning layer.

In some embodiments, the operational frequency of the wireless signal is greater than or equal to 28 GHz.

In some embodiments, the display device is an OLED (Organic Light-Emitting Diode) display device.

In some embodiments, the second display portion includes an anode layer, a cathode layer, and a light-emitting layer. The light-emitting layer is made of an organic luminescent material. The light-emitting layer is disposed between the anode layer and the cathode layer.

In some embodiments, the phase tuning layer is adjacent to the anode layer or the cathode layer.

In some embodiments, the phase tuning layer includes a plurality of conductive structure units arranged periodically.

In some embodiments, the conductive structure units are made of transparent conductive materials.

In some embodiments, each of the conductive structure units substantially has a rectangular ring shape.

In some embodiments, the distance between any two adjacent conductive structure units is shorter than or equal to 0.25 wavelength of the operational frequency.

In some embodiments, the communication device further includes a voltage-controlled metal layer and a voltage controller. The voltage-controlled metal layer is disposed adjacent to the phase tuning layer. The voltage controller provides an operational voltage for the voltage-controlled metal layer.

In some embodiments, the radiating direction of the wireless signal is adjustable according to different levels of the operational voltage.

In some embodiments, the voltage-controlled metal layer is integrated with the anode layer or the cathode layer.

In another preferred embodiment, the invention proposes a communication device includes a display device, a phase tuning layer, a voltage-controlled metal layer, and a voltage controller. The display device includes a first display portion and a second display portion. The pixel density of the first display portion is greater than that of the second display portion. The phase tuning layer is disposed adjacent to the second display portion. The voltage-controlled metal layer is disposed adjacent to the phase tuning layer. The voltage controller provides an operational voltage for the voltage-controlled metal layer. The second display portion, the phase tuning layer, and the voltage-controlled metal layer are configured to reflect a wireless signal.

In some embodiments, the reflecting direction of the wireless signal is adjustable according to different levels of the operational voltage.

In a preferred embodiment, the invention proposes a communication method that includes the steps of: providing a display device, wherein the display device comprises a first display portion and a second display portion, and a pixel density of the first display portion is greater than that of the second display portion; disposing a phase tuning layer adjacent to the second display portion; generating a wireless signal via an mmWave module; and propagating the wireless signal through the second display portion and the phase tuning layer.

In another preferred embodiment, the invention proposes a communication method that includes the steps of: providing a display device, wherein the display device comprises a first display portion and a second display portion, and a pixel density of the first display portion is greater than that of the second display portion; disposing a phase tuning layer adjacent to the second display portion; disposing a voltage-controlled metal layer adjacent to the phase tuning layer; providing an operational voltage for the voltage-controlled metal layer via a voltage controller; and reflecting a wireless signal via the second display portion, the phase tuning layer, and the voltage-controlled metal layer.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
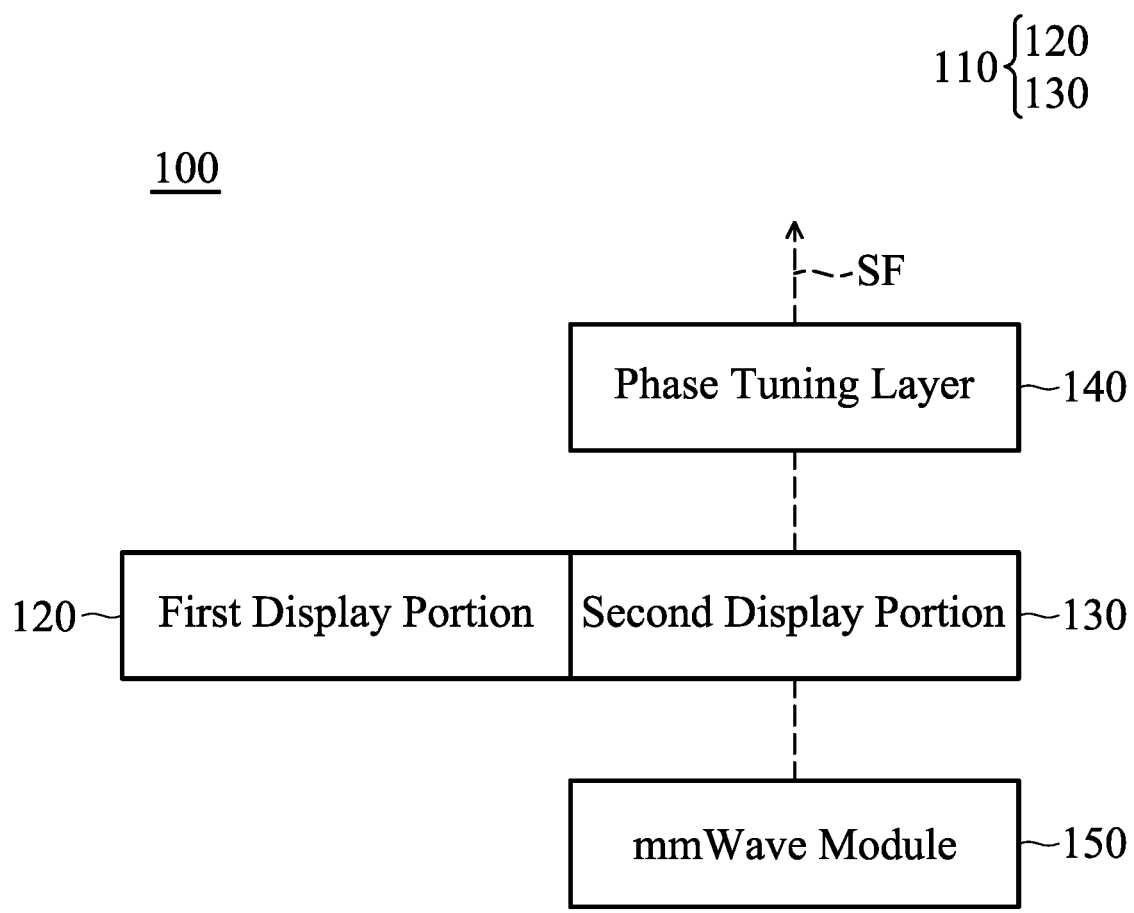
FIG. 1 is a diagram of a communication device according to an embodiment of the invention.

In order to illustrate the foregoing and other purposes, features and advantages of the invention, the embodiments and figures of the invention will be described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagram of a communication device 100 according to an embodiment of the invention. For example, the communication device 100 may be applied to an HMD (Head Mounted Display) or a mobile device, such as a smart phone, a tablet computer, or a notebook computer. In the embodiment of FIG. 1, the communication device 100 includes a display device 110, a phase tuning layer 140, and a mmWave (Millimeter Wave) module 150. It should be understood that the communication device 100 may further include other components, such as a housing for accommodating the display device 110, the phase tuning layer 140 and the mmWave module 150, although they are not displayed in FIG. 1.

The type and style of the display device 110 are not limited in the invention. The display device 110 includes a first display portion 120 and a second display portion 130. The pixel density of the first display portion 120 is greater than that of the second display portion 130. For example, the first display portion 120 may be substantially positioned at the center of the display device 110, and the second display portion 130 may be substantially positioned at the edge of the display device 110, but they are not limited thereto. The phase tuning layer 140 is adjacent to the second display portion 130. The mmWave module 150 generates a wireless signal SF. The wireless signal SF is propagated through the second display portion 130 and the phase tuning layer 140. For example, the operational frequency of the wireless signal SF may be greater than or equal to 28 GHz. It should be noted that the term "adjacent" or "close" over the disclosure means that the distance (spacing) between two corresponding elements is smaller than a predetermined distance (e.g., 10 mm or shorter), or means that the two corresponding elements directly touch each other (i.e., the aforementioned distance (spacing) between them is reduced to 0).

Figure 2A:
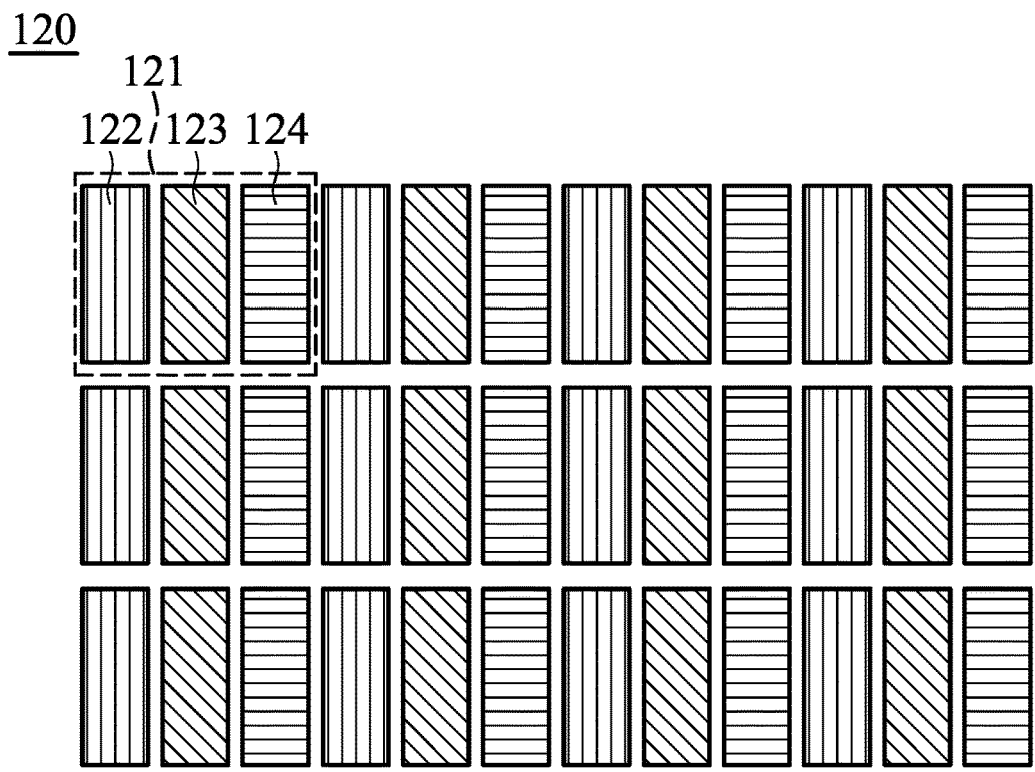
FIG. 2A is a diagram of a first display portion of a display device according to an embodiment of the invention.

FIG. 2A is a diagram of the first display portion 120 of the display device 110 according to an embodiment of the invention. In the embodiment of FIG. 2A, the first display portion 120 includes a plurality of pixel units 121, and each pixel unit 121 includes a first sub-pixel 122, a second sub-pixel 123, and a third sub-pixel 124. For example, the first sub-pixel 122, the second sub-pixel 123, and the third sub-pixel 124 may provide three primary colors including red light, green light and blue light, respectively. It should be understood that the size and arrangement of each sub-pixel may be slightly adjustable according to different processes of each panel factory.

Figure 2B:
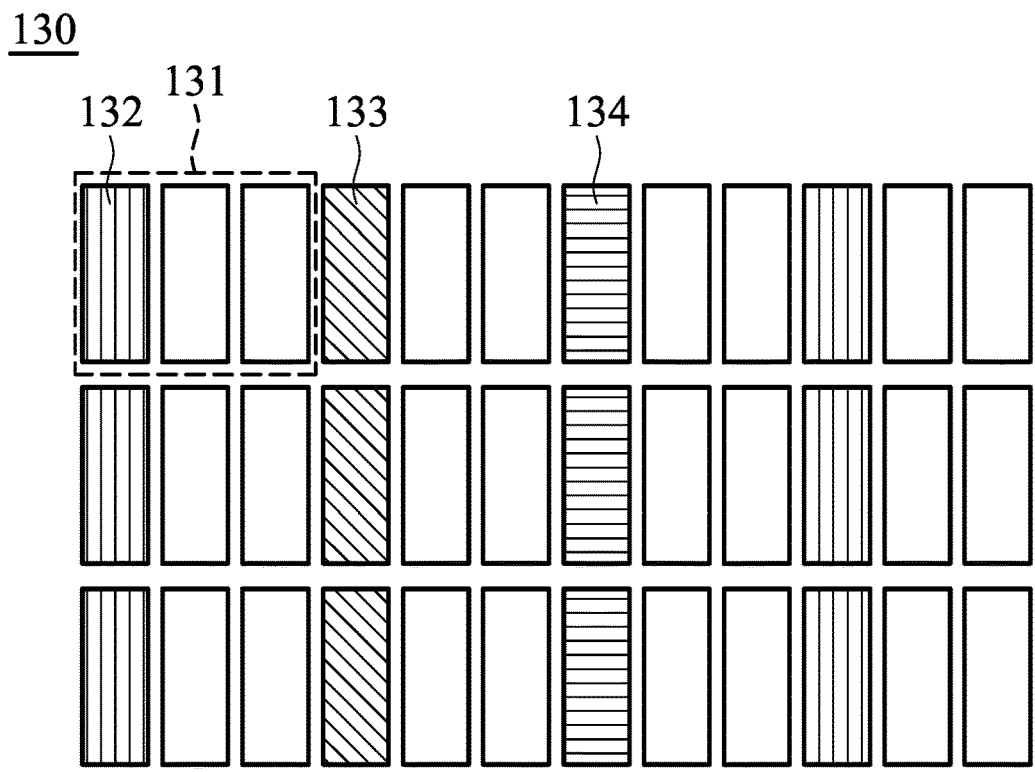
FIG. 2B is a diagram of a second display portion of a display device according to an embodiment of the invention.

FIG. 2B is a diagram of the second display portion 130 of the display device 110 according to an embodiment of the invention. In the embodiment of FIG. 2B, the second display portion 130 includes a plurality of pixel units 131, and each pixel unit 131 includes only one of a first sub-pixel 132, a second sub-pixel 133, and a third sub-pixel 134. For example, the first sub-pixel 132, the second sub-pixel 133, and the third sub-pixel 134 may provide three primary colors including red light, green light and blue light, respectively. With such a design, since the pixel density of the second display portion 130 is merely ⅓ of that of the first display portion 120, users do not easily observe the existence of the mmWave module 150, and the second display portion 130 does not negatively affect the propagation of the wireless signal SF so much. In other words, the proposed design can effectively integrate the display device 110 with the mmWave module 150, thereby reducing the whole device size. However, the invention is not limited thereto. In alternative embodiments, the pixel density and pixel size of the first display portion 120 and the second display portion 130 are adjustable according to different requirements.

Figure 3A:
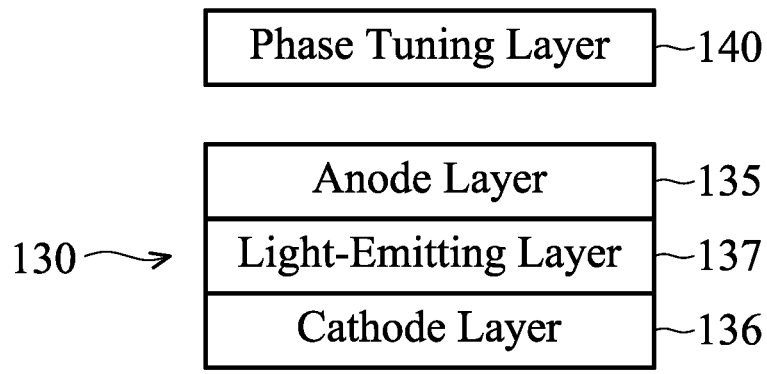
FIG. 3A is a diagram of a second display portion and a phase tuning layer according to an embodiment of the invention.

FIG. 3A is a diagram of the second display portion 130 and the phase tuning layer 140 according to an embodiment of the invention. In the embodiment of FIG. 3A, the display device 110 is an OLED (Organic Light-Emitting Diode) display device. The second display portion 130 includes an anode layer 135, a cathode layer 136, and a light-emitting layer 137. The aforementioned pixel unit 131 may be formed by the anode layer 135, the cathode layer 136, and the light-emitting layer 137. Specifically, the phase tuning layer 140 is adjacent to the anode layer 135. The light-emitting layer 137 is disposed between the anode layer 135 and the cathode layer 136. For example, the light-emitting layer 137 may be made of an organic luminescent material.

Figure 3B:
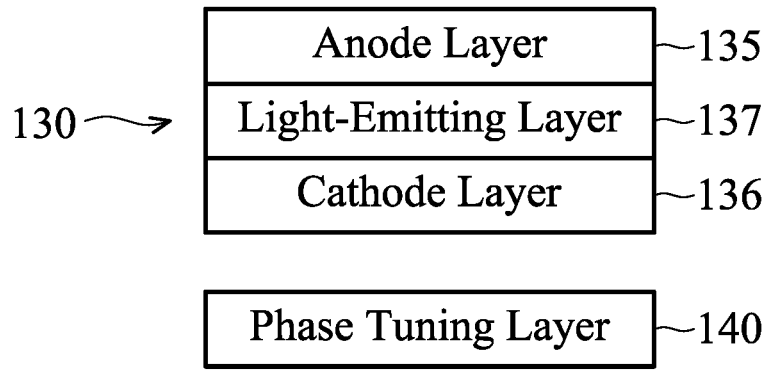
FIG. 3B is a diagram of a second display portion and a phase tuning layer according to another embodiment of the invention.

FIG. 3B is a diagram of the second display portion 130 and the phase tuning layer 140 according to another embodiment of the invention. FIG. 3B is similar to FIG. 3A. In the embodiment of FIG. 3B, the phase tuning layer 140 is adjacent to the cathode layer 136, rather than the anode layer 135.

Figure 3C:
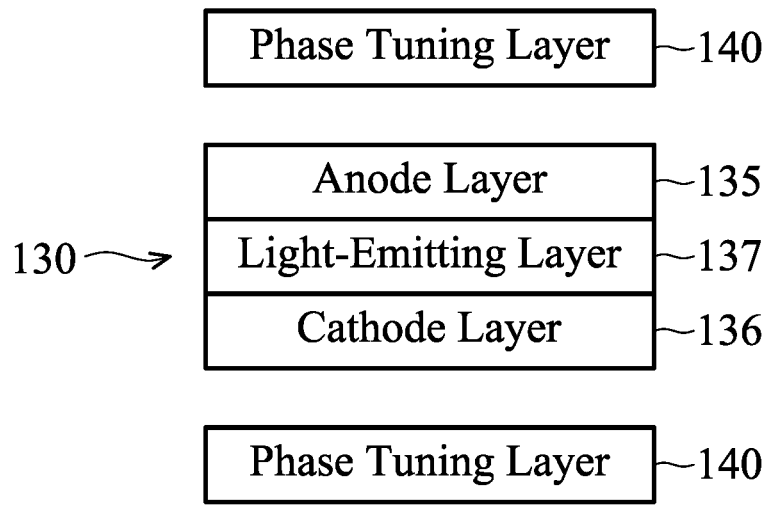
FIG. 3C is a diagram of a second display portion and a phase tuning layer according to another embodiment of the invention.

FIG. 3C is a diagram of the second display portion 130 and the phase tuning layer 140 according to another embodiment of the invention. FIG. 3C is similar to FIG. 3A. In the embodiment of FIG. 3C, the communication device 100 includes two phase tuning layers 140, which are adjacent to the anode layer 135 and the cathode layer 136, respectively. Other features of the embodiments of FIG. 3B and FIG. 3C are similar to those of FIG. 3A. Thus, these embodiments can achieve similar levels of performance.

Figure 4:
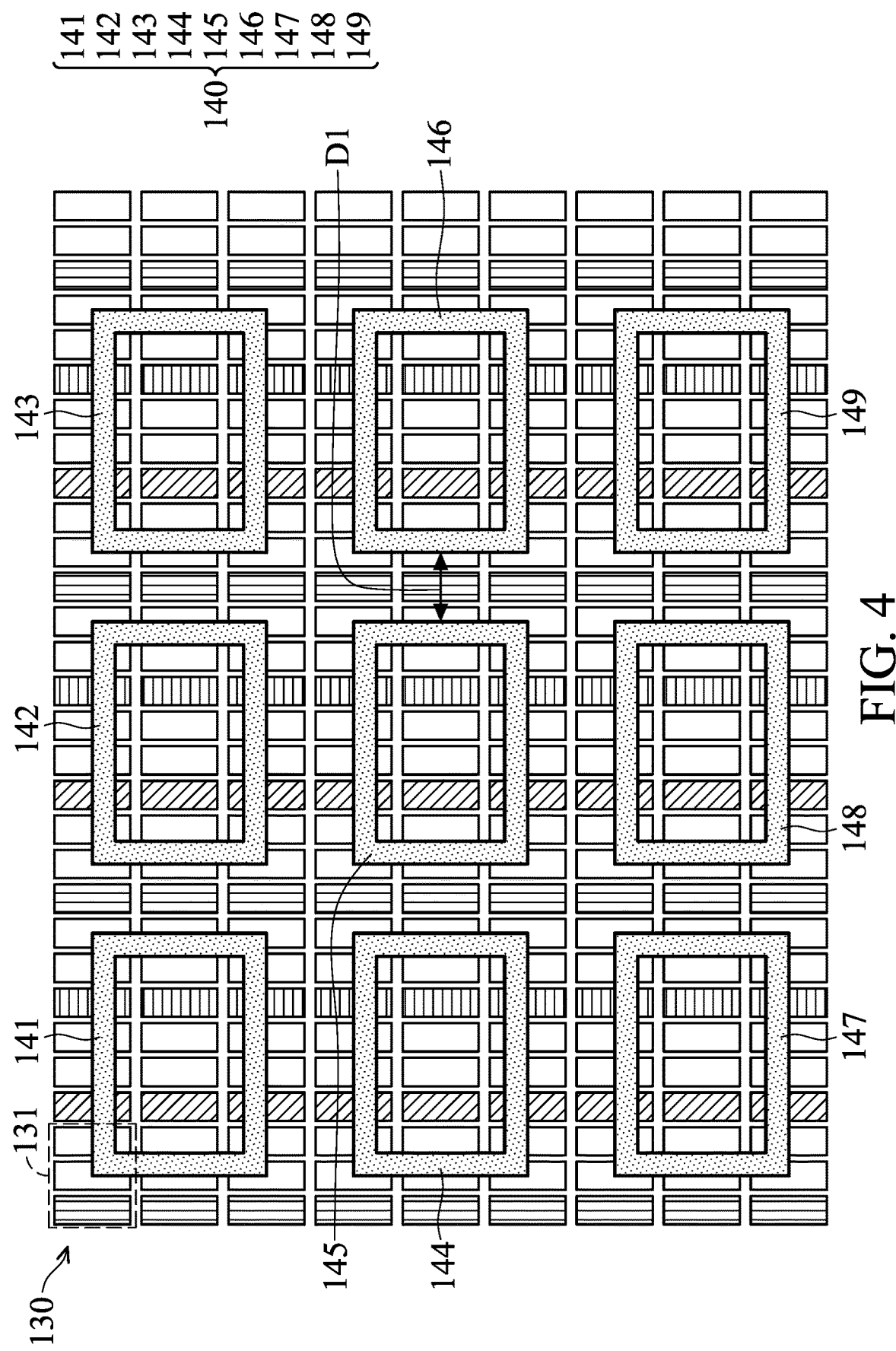
FIG. 4 is a diagram of a phase tuning layer according to an embodiment of the invention.
Figure 5A:
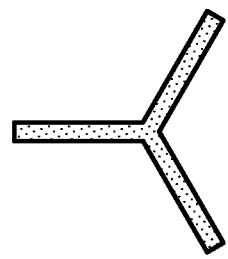
FIGS. 5A-5L are diagrams of conductive structure units according to other embodiments of the invention.
Figure 5B:
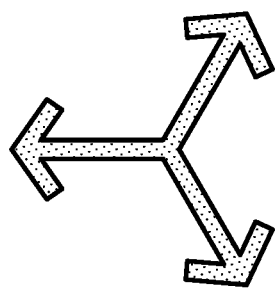
Figure 5C:
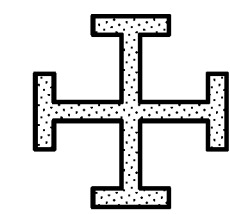
Figure 5D:
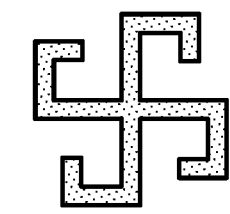
Figure 5E:
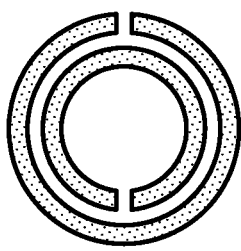
Figure 5F:
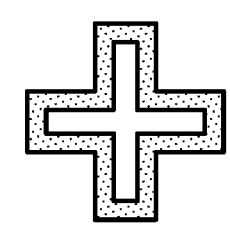
Figure 5G:
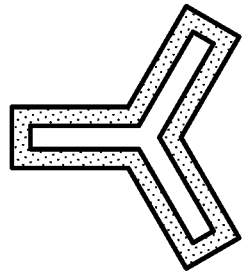
Figure 5H:
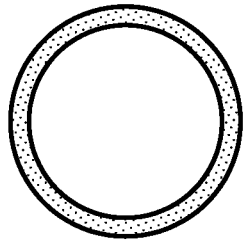
Figure 5I:
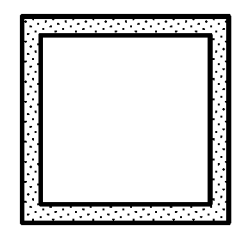
Figure 5J:
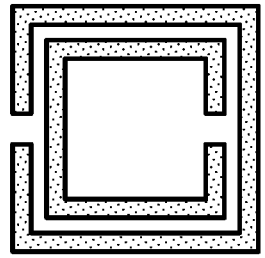
Figure 5K:
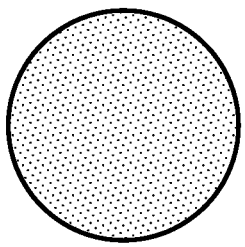
Figure 5L:
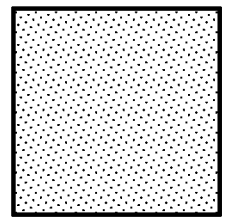

FIG. 4 is a diagram of the phase tuning layer 140 according to an embodiment of the invention. In the embodiment of FIG. 4, the phase tuning layer 140 includes a plurality of conductive structure units 141, 142, 143, 144, 145, 146, 147, 148 and 149 arranged periodically. The conductive structure units 141, 142, 143, 144, 145, 146, 147, 148 and 149 may be made of transparent conductive materials, such as ITO (Indium Tin Oxide) or graphene. The conductive structure units 141, 142, 143, 144, 145, 146, 147, 148 and 149 may all be floating and separated from each other. For example, each of the conductive structure units 141, 142, 143, 144, 145, 146, 147, 148 and 149 may substantially have a rectangular ring shape, but it is not limited thereto. In addition, each of the conductive structure units 141, 142, 143, 144, 145, 146, 147, 148 and 149 may extend across multiple pixel units 131 of the second display portion 130. In some embodiments, the distance D1 between any two adjacent conductive structure units 141, 142, 143, 144, 145, 146, 147, 148 and 149 may be shorter than or equal to 0.25 wavelength (λ/4) of the operational frequency of the wireless signal SF. According to practical measurements, the incorporation of the phase tuning layer 140 can help to increase the radiation gain of the wireless signal SF. However, the invention is not limited thereto. In alternative embodiments, the phase tuning layer 140 includes fewer or more conductive structure units.

FIGS. 5A-5L are diagrams of the conductive structure units according to other embodiments of the invention. In the embodiments of FIGS. 5A-5L, each conductive structure unit may substantially have a circular shape, a square shape, a cross shape, or other hollow ring shape, but it is not limited thereto.

Figure 6A:
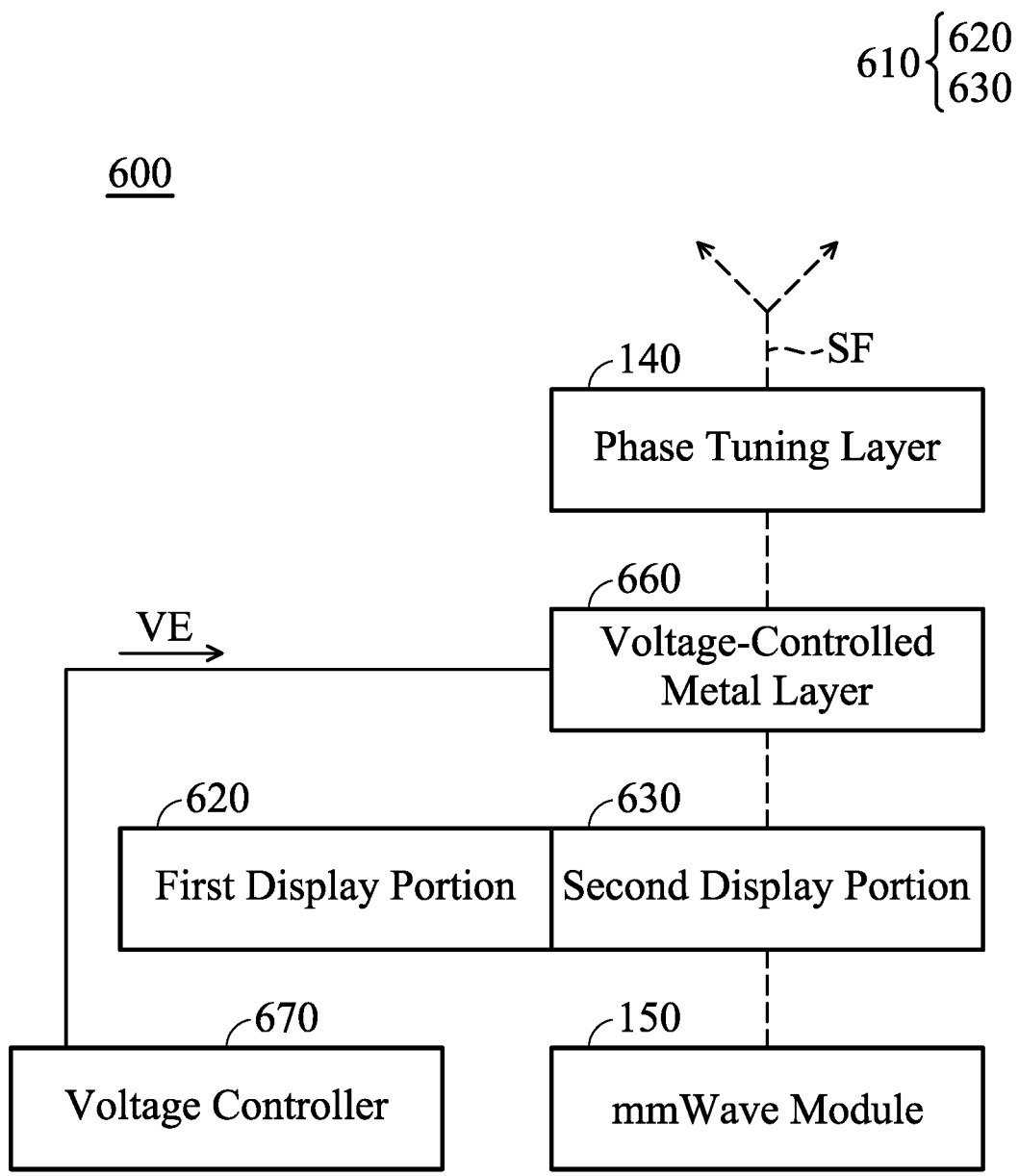
FIG. 6A is a diagram of a communication device according to an embodiment of the invention.
Figure 6B:
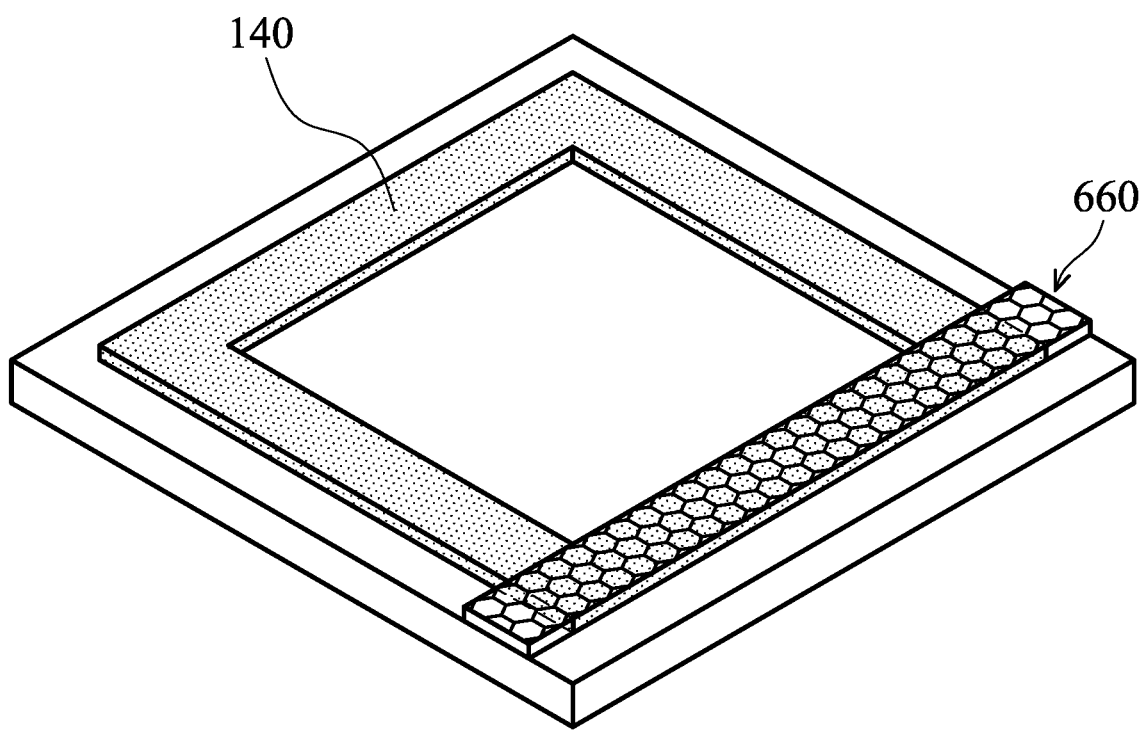
FIG. 6B is a diagram of a voltage-controlled metal layer according to an embodiment of the invention.
Figure 6C:
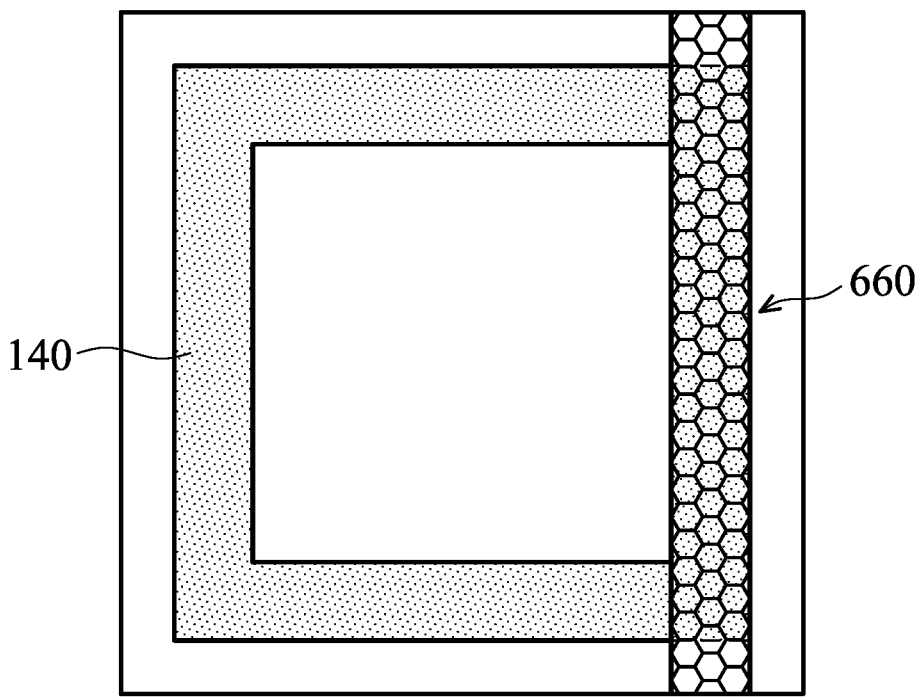
FIG. 6C is a diagram of a voltage-controlled metal layer according to another embodiment of the invention.
Figure 6D:
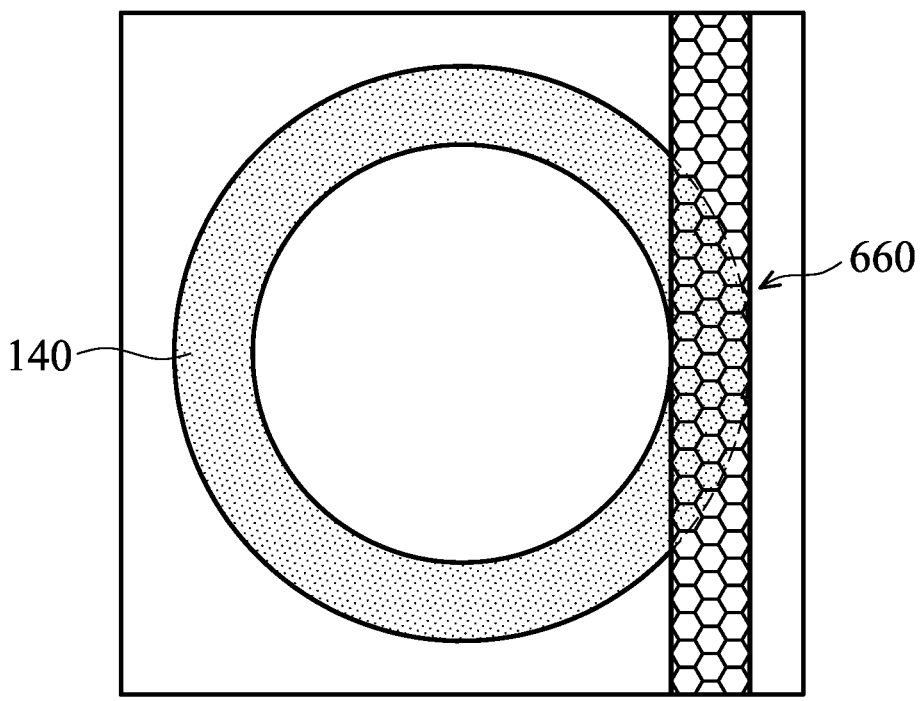
FIG. 6D is a diagram of a voltage-controlled metal layer according to another embodiment of the invention.

FIG. 6A is a diagram of a communication device 600 according to an embodiment of the invention. FIG. 6A is similar to FIG. 1. In the embodiment of FIG. 6A, the communication device 600 includes a display device 610, a phase tuning layer 140, a mmWave module 150, a voltage-controlled metal layer 660, and a voltage controller 670. The display device 610 includes a first display portion 620 and a second display portion 630. The pixel density of the first display portion 620 is greater than that of the second display portion 630. The phase tuning layer 140 is adjacent to the second display portion 630. The voltage-controlled metal layer 660 is adjacent to the phase tuning layer 140. For example, the voltage-controlled metal layer 660 may be made of the graphene materials of FIG. 6B, FIG. 6C and FIG. 6D. The voltage-controlled metal layer 660 may be distributed in a coupling-strip form or a coupling-patch form, and it may be adjacent to the top and/or bottom phase tuning layer(s) 140. FIG. 6B is a diagram of the voltage-controlled metal layer 660 according to an embodiment of the invention. FIG. 6C is a diagram of the voltage-controlled metal layer 660 according to another embodiment of the invention. FIG. 6D is a diagram of the voltage-controlled metal layer 660 according to another embodiment of the invention. It should be noted that in FIG. 6B, FIG. 6C and FIG. 6D, all of the hexagonal grids represent the graphene materials. Generally, the voltage-controlled metal layer 660 is used to control the coupling characteristic and the phase offset of the phase tuning layer 140. The voltage controller 670 provides an operational voltage VE for the voltage-controlled metal layer 660. At this time, the conductivity of the voltage-controlled metal layer 660 (e.g., the graphene material but not limited thereto) may be changed because of a specific bias of the operational voltage VE. Thus, the coupling characteristics and the frequency response characteristics of the phase tuning layer 140 and its adjacent voltage-controlled metal layer 660 may also be modified, so as to provide a corresponding effective phase. The mmWave module 150 generates a wireless signal SF. The wireless signal SF is propagated through the second display portion 630, the voltage-controlled metal layer 660, and the phase tuning layer 140. It should be noted that the radiating direction of the wireless signal SF is adjustable according to different levels of the operational voltage VE. For example, if the level of the operational voltage VE becomes higher, the radiating direction of the wireless signal SF may deflect toward the left; conversely, if the level of the operational voltage VE becomes lower, the radiating direction of the wireless signal SF may deflect toward the right, but it is not limited thereto. With such a design, the propagating direction of the wireless signal SF can be easily controlled by changing the operational voltage VE. Other features of the communication device 600 of FIG. 6A are similar to those of the communication device 100 of FIG. 1. Therefore, the two embodiments can achieve similar levels of performance.

Figure 7A:
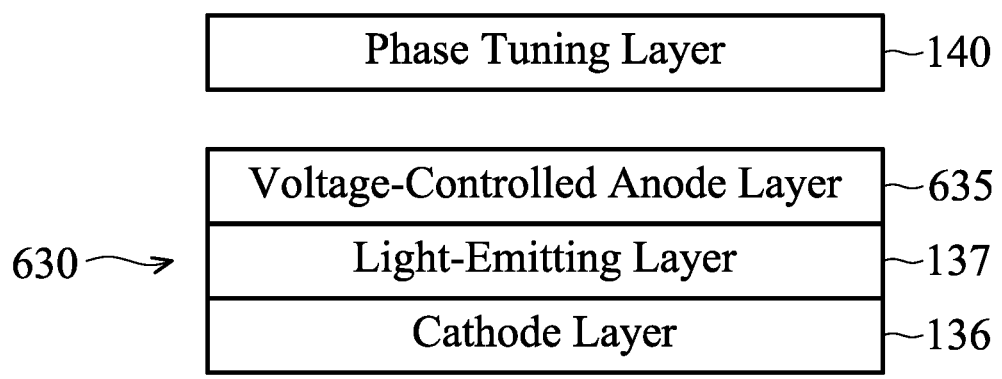
FIG. 7A is a diagram of a second display portion and a phase tuning layer according to an embodiment of the invention.

FIG. 7A is a diagram of the second display portion 630 and the phase tuning layer 140 according to an embodiment of the invention. In the embodiment of FIG. 7A, the voltage-controlled metal layer 660 is integrated with the anode layer of the second display portion 630, so as to form a voltage-controlled anode layer 635. For example, the voltage-controlled metal layer 660 may be printed on the anode layer of the second display portion 630, thereby reducing the whole thickness of them. The voltage-controlled anode layer 635 is adjacent to the phase tuning layer 140.

Figure 7B:
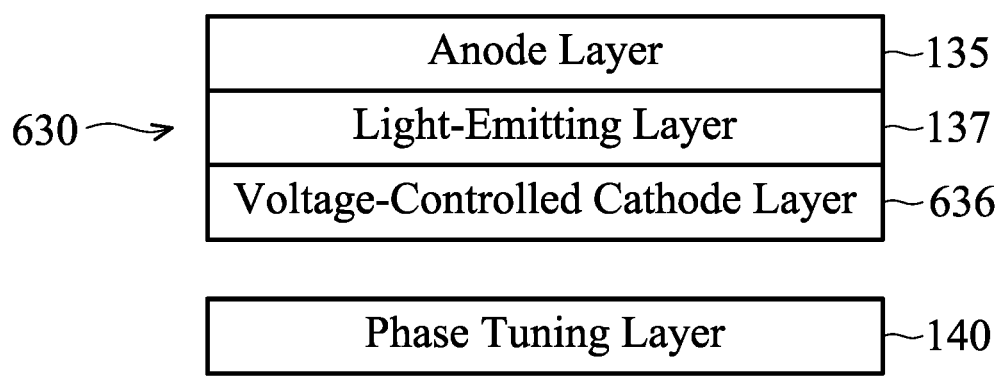
FIG. 7B is a diagram of a second display portion and a phase tuning layer according to another embodiment of the invention.

FIG. 7B is a diagram of the second display portion 630 and the phase tuning layer 140 according to another embodiment of the invention. In the embodiment of FIG. 7B, the voltage-controlled metal layer 660 is integrated with the cathode layer of the second display portion 630, so as to form a voltage-controlled cathode layer 636. For example, the voltage-controlled metal layer 660 may be printed on the cathode layer of the second display portion 630, thereby reducing the whole thickness of them. The voltage-controlled cathode layer 636 is adjacent to the phase tuning layer 140. In other embodiments, if the communication device 600 includes two phase tuning layers 140, the phase tuning layers 140 may be adjacent to the voltage-controlled anode layer 635 and the voltage-controlled cathode layer 636, respectively.

Figure 8:
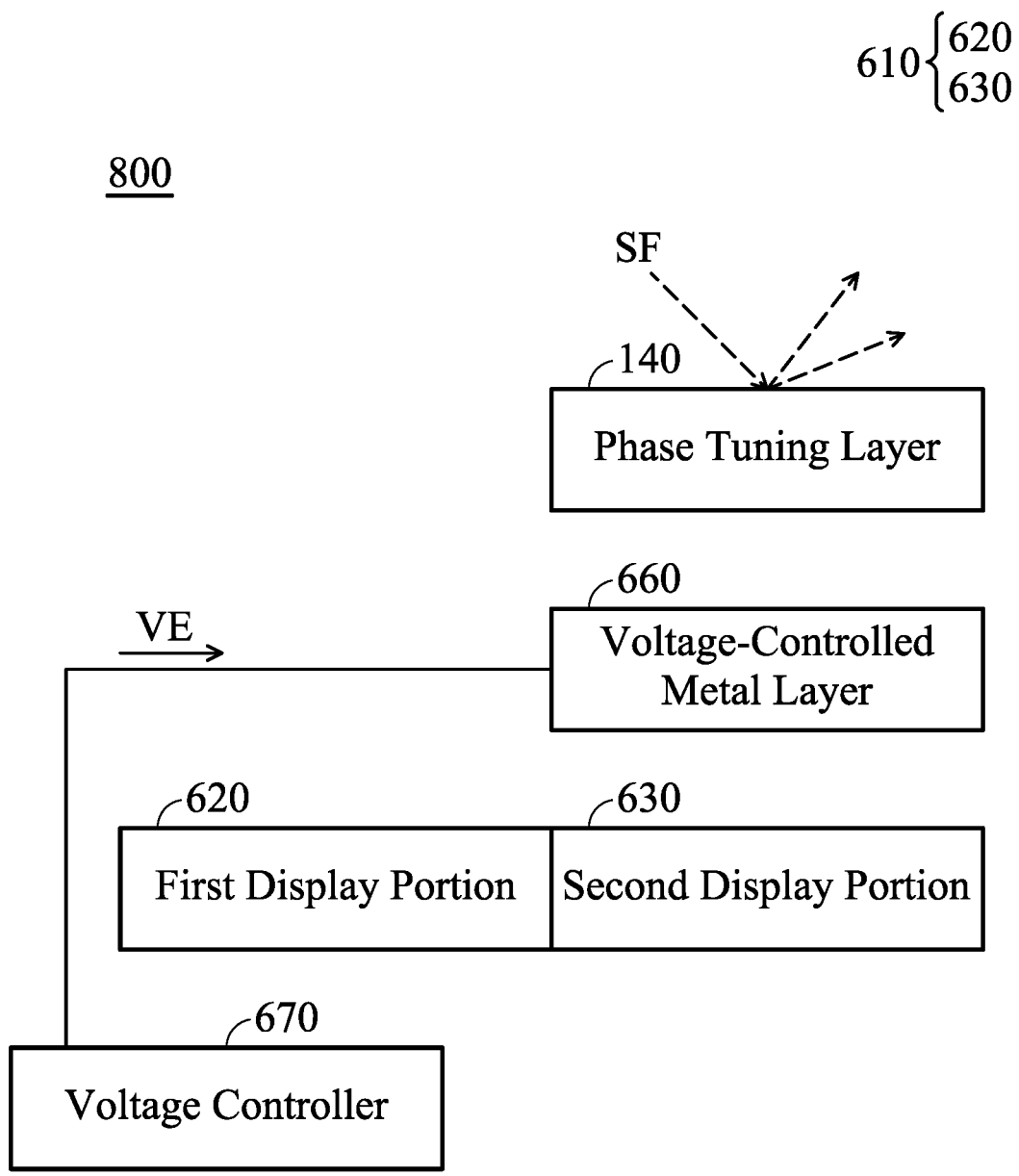
FIG. 8 is a diagram of a communication device according to another embodiment of the invention.

FIG. 8 is a diagram of a communication device 800 according to another embodiment of the invention. FIG. 8 is similar to FIG. 6. In the embodiment of FIG. 8, the communication device 800 includes a display device 610, a phase tuning layer 140, a voltage-controlled metal layer 660, and a voltage controller 670. The display device 610 includes a first display portion 620 and a second display portion 630. The pixel density of the first display portion 620 is greater than that of the second display portion 630. The phase tuning layer 140 is adjacent to the second display portion 630. The voltage-controlled metal layer 660 is adjacent to the phase tuning layer 140. The voltage controller 670 provides an operational voltage VE for the voltage-controlled metal layer 660. The second display portion 630, the phase tuning layer 140, and the voltage-controlled metal layer 660 are configured to reflect a wireless signal SF. In some embodiments, the communication device 800 does not include a mmWave module. The wireless signal SF may come from other external devices (not shown). It should be noted that the reflecting direction of the wireless signal SF is adjustable according to different levels of the operational voltage VE. For example, if the level of the operational voltage VE becomes higher, the reflective angle of the wireless signal SF may increase; conversely, if the level of the operational voltage VE becomes lower, the reflective angle of the wireless signal SF may decrease, but it is not limited thereto. With such a design, the reflective direction of the wireless signal SF can be easily controlled by changing the operational voltage VE. Other features of the communication device 800 of FIG. 8 are similar to those of the communication device 600 of FIG. 6. Therefore, the two embodiments can achieve similar levels of performance.

Figure 9:
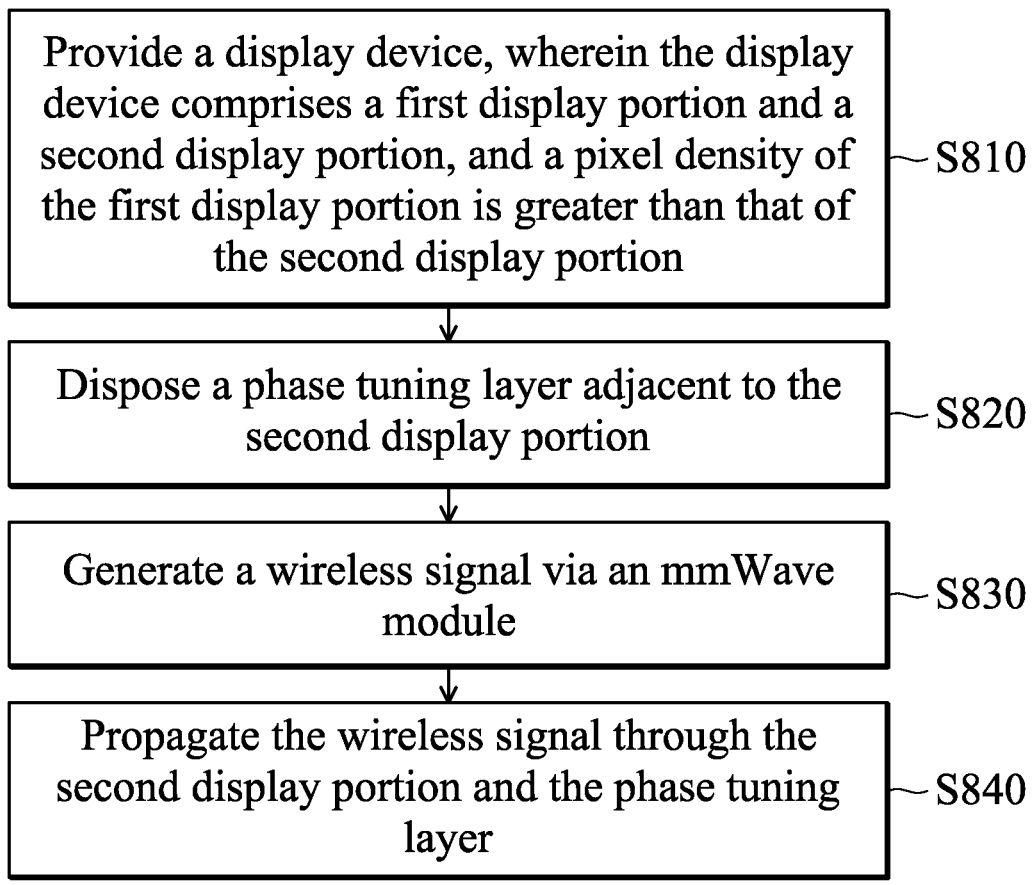
FIG. 9 is a flowchart of a communication method according to an embodiment of the invention.

FIG. 9 is a flowchart of a communication method according to an embodiment of the invention. In step S810, a display device is provided. The display device includes a first display portion and a second display portion. The pixel density of the first display portion is greater than that of the second display portion. In step S820, a phase tuning layer is disposed adjacent to the second display portion. In step S830, a wireless signal is generated by a mmWave module. In step S840, the wireless signal is propagated through the second display portion and the phase tuning layer. It should be understood that these steps are not required to be performed in order, and every feature of the embodiments of FIGS. 1 to 8 may be applied to the communication method of FIG. 9.

Figure 10:
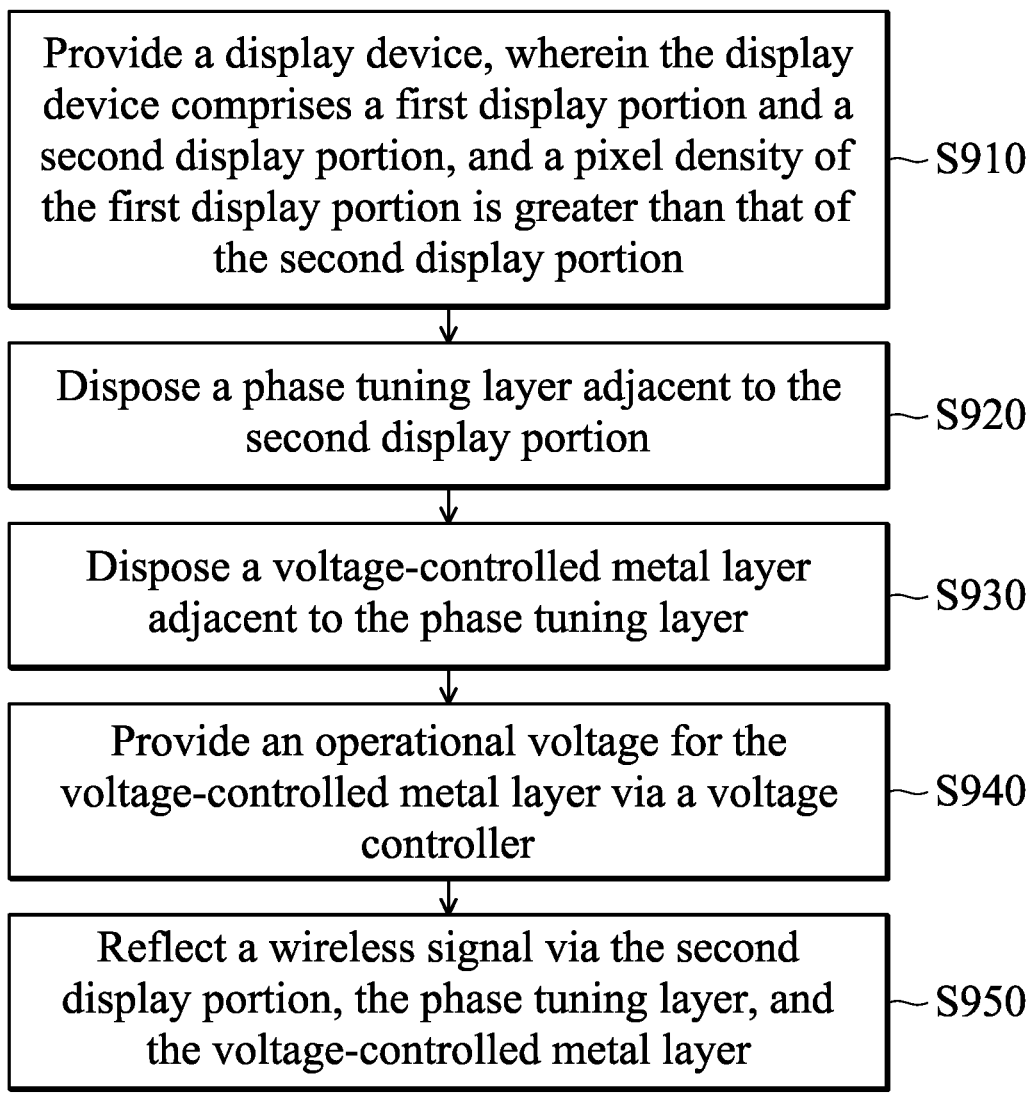
FIG. 10 is a flowchart of a communication method according to another embodiment of the invention.

FIG. 10 is a flowchart of a communication method according to another embodiment of the invention. In step S910, a display device is provided. The display device includes a first display portion and a second display portion. The pixel density of the first display portion is greater than that of the second display portion. In step S920, a phase tuning layer is disposed adjacent to the second display portion. In step S930, a voltage-controlled metal layer is disposed adjacent to the phase tuning layer. In step S940, an operational voltage is provided for the voltage-controlled metal layer via a voltage controller. In step S950, a wireless signal is reflected via the second display portion, the phase tuning layer, and the voltage-controlled metal layer. It should be understood that these steps are not required to be performed in order, and every feature of the embodiments of FIGS. 1 to 8 may be applied to the communication method of FIG. 10.

The invention proposed a novel communication device and a novel communication method. In comparison to the conventional design, the invention has at least the advantages of minimizing the whole size, eliminating the interference, and reducing the manufacturing cost. Therefore, the invention is suitable for application in a variety of devices.

Note that the above element parameters are not limitations of the invention. A designer can fine-tune these setting values according to different requirements. It should be understood that the communication device and communication method of the invention are not limited to the configurations of FIGS. 1-10. The invention may include any one or more features of any one or more embodiments of FIGS. 1-10. In other words, not all of the features displayed in the figures should be implemented in the communication device and communication method of the invention.

The method of the invention, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A communication device, comprising:
   a display device, comprising a first display portion and a second display portion, wherein a pixel density of the first display portion is greater than that of the second display portion;
   a phase tuning layer, disposed adjacent to the second display portion; and
   a mmWave module, generating a wireless signal, wherein the wireless signal is propagated through the second display portion and the phase tuning layer.

2. The communication device as claimed in claim 1, wherein an operational frequency of the wireless signal is greater than or equal to 28 GHz.

3. The communication device as claimed in claim 2, wherein the phase tuning layer comprises a plurality of conductive structure units arranged periodically.

4. The communication device as claimed in claim 3, wherein the conductive structure units are made of transparent conductive materials.

5. The communication device as claimed in claim 3, wherein each of the conductive structure units substantially has a rectangular ring shape.

6. The communication device as claimed in claim 3, wherein a distance between any adjacent two of the conductive structure units is shorter than or equal to 0.25 wavelength of the operational frequency.

7. The communication device as claimed in claim 1, wherein the display device is an OLED display device.

8. The communication device as claimed in claim 1, wherein the second display portion comprises:
   an anode layer;
   a cathode layer; and
   a light-emitting layer, made of an organic luminescent material, wherein the light-emitting layer is disposed between the anode layer and the cathode layer.

9. The communication device as claimed in claim 8, wherein the phase tuning layer is adjacent to the anode layer or the cathode layer.

10. The communication device as claimed in claim 8, further comprising:
    a voltage-controlled metal layer, disposed adjacent to the phase tuning layer; and
    a voltage controller, providing an operational voltage for the voltage-controlled metal layer.

11. The communication device as claimed in claim 10, wherein a radiating direction of the wireless signal is adjustable according to different levels of the operational voltage.

12. The communication device as claimed in claim 10, wherein the voltage-controlled metal layer is integrated with the anode layer or the cathode layer.

13. A communication device, comprising:
    a display device, comprising a first display portion and a second display portion, wherein a pixel density of the first display portion is greater than that of the second display portion;
    a phase tuning layer, disposed adjacent to the second display portion;
    a voltage-controlled metal layer, disposed adjacent to the phase tuning layer; and
    a voltage controller, providing an operational voltage for the voltage-controlled metal layer;
    wherein the second display portion, the phase tuning layer, and the voltage-controlled metal layer are configured to reflect a wireless signal.

14. The communication device as claimed in claim 13, wherein a reflecting direction of the wireless signal is adjustable according to different levels of the operational voltage.

15. The communication device as claimed in claim 13, wherein the display device is an OLED display device.

16. The communication device as claimed in claim 13, wherein the second display portion comprises:
    an anode layer;
    a cathode layer; and
    a light-emitting layer, made of an organic luminescent material, wherein the light-emitting layer is disposed between the anode layer and the cathode layer.

17. The communication device as claimed in claim 16, wherein the voltage-controlled metal layer is integrated with the anode layer or the cathode layer.

18. The communication device as claimed in claim 13, wherein the phase tuning layer comprises a plurality of conductive structure units arranged periodically.

19. A communication method, comprising the steps of:
    providing a display device, wherein the display device comprises a first display portion and a second display portion, and a pixel density of the first display portion is greater than that of the second display portion;
    disposing a phase tuning layer adjacent to the second display portion;
    generating a wireless signal via a mmWave module; and
    propagating the wireless signal through the second display portion and the phase tuning layer.

20. A communication method, comprising the steps of:
    providing a display device, wherein the display device comprises a first display portion and a second display portion, and a pixel density of the first display portion is greater than that of the second display portion;
    disposing a phase tuning layer adjacent to the second display portion;
    disposing a voltage-controlled metal layer adjacent to the phase tuning layer;
    providing an operational voltage for the voltage-controlled metal layer via a voltage controller; and
    reflecting a wireless signal via the second display portion, the phase tuning layer, and the voltage-controlled metal layer.

* * * * *